United States Patent
Ayyapureddi

(10) Patent No.: US 12,400,702 B2
(45) Date of Patent: Aug. 26, 2025

(54) APPARATUSES AND METHODS TO DEPRIORITIZE TRAFFIC TO UNAVAILABLE MEMORY BANKS

(71) Applicant: MICRON TECHNOLOGY, INC., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 17/954,176

(22) Filed: Sep. 27, 2022

(65) Prior Publication Data

US 2024/0105251 A1 Mar. 28, 2024

(51) Int. Cl.
*G11C 11/406* (2006.01)

(52) U.S. Cl.
CPC ... *G11C 11/40618* (2013.01); *G11C 11/40611* (2013.01); *G11C 11/40615* (2013.01)

(58) Field of Classification Search
CPC ......... G11C 11/40618; G11C 11/40611; G11C 11/40615
See application file for complete search history.

(56) References Cited

U.S. PATENT DOCUMENTS

| | | | |
|---|---|---|---|
| 6,587,918 B1 * | 7/2003 | Christenson | G11C 11/40603 711/158 |
| 11,783,885 B2 * | 10/2023 | Kim | G11C 11/40615 365/222 |
| 2002/0060940 A1 * | 5/2002 | Tomita | G11C 11/406 365/222 |
| 2016/0070483 A1 * | 3/2016 | Yoon | G06F 13/1694 711/154 |
| 2017/0169880 A1 * | 6/2017 | Bains | G11C 11/4074 |
| 2021/0358540 A1 * | 11/2021 | Brandl | G11C 11/40615 |
| 2022/0066700 A1 * | 3/2022 | Kim | G11C 11/40615 |
| 2022/0139448 A1 * | 5/2022 | Kim | G11C 7/1009 365/222 |

* cited by examiner

*Primary Examiner* — Mushfique Siddique
(74) *Attorney, Agent, or Firm* — Dorsey & Whitney LLP

(57) ABSTRACT

An exemplary memory controller includes a refresh manager circuit configured to provide a refresh command to a memory system via a command and address bus to initiate a refresh operation at a bank of the memory system. In response to provision of the refresh command, the refresh manager circuit is further configured to issue a bank status command to the host to indicate that the bank of the memory system has switched to unavailable.

17 Claims, 5 Drawing Sheets

APPARATUSES AND METHODS TO DEPRIORITIZE TRAFFIC TO UNAVAILABLE MEMORY BANKS

BACKGROUND OF THE INVENTION

Latency in computing systems is something that is always looking to be improved. Tail latency is also becoming an important issue to be addressed. Tail latencies are infrequent, high-percentile latencies that should occur fairly infrequently. Increased refresh frequency and/or longer refresh periods can lead to an increase in tail latency, as certain memory banks become unavailable during these refresh periods. This increase in tail latencies can cause significant processing delays in certain applications.

DETAILED DESCRIPTION

Certain details are set forth below to provide a sufficient understanding of embodiments of the present disclosure. However, it will be clear to one skilled in the art that embodiments of the present disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
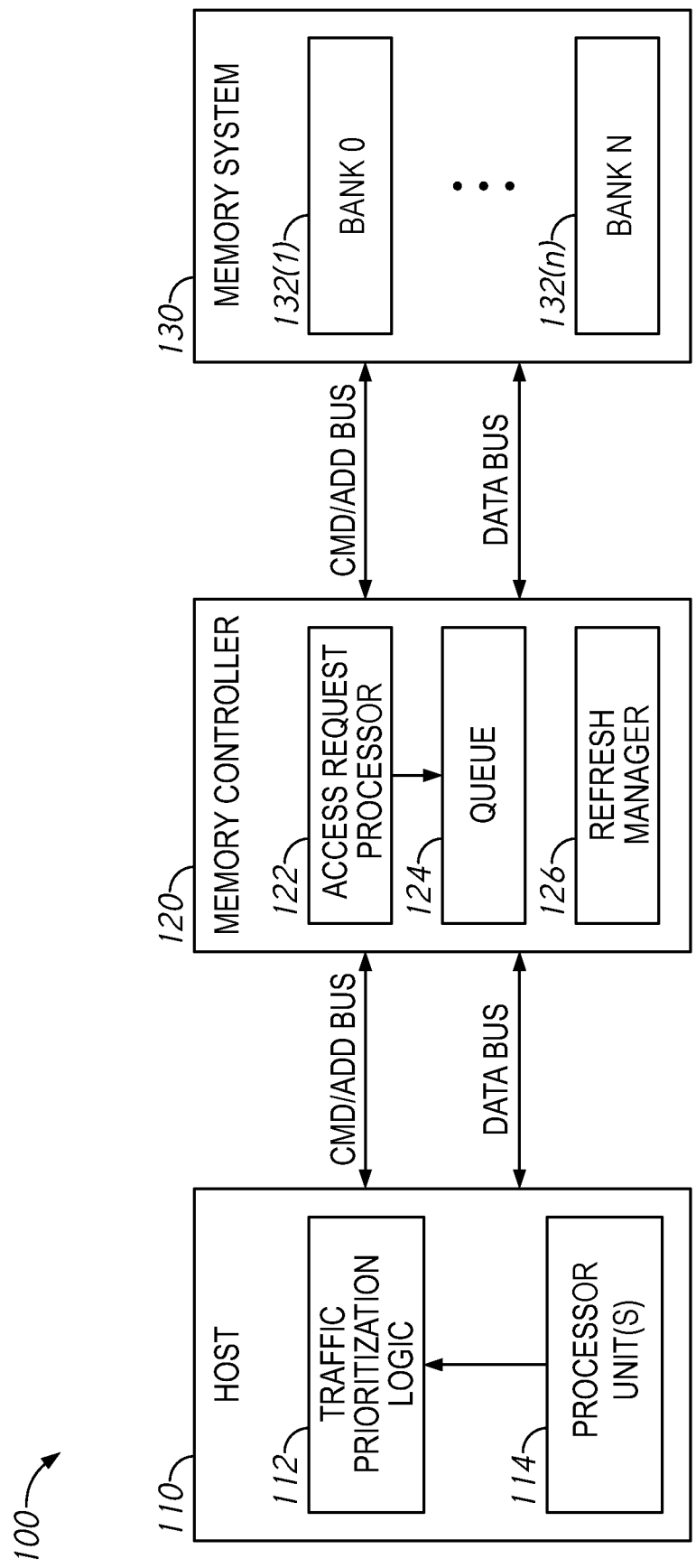
FIG. 1 is a block diagram of a computing system that includes a host, a memory controller, and a memory system, in accordance with an embodiment of the disclosure.

FIG. 1 is a block diagram of a computing system 100 that includes a host 110, a memory controller 120, and a memory system 130, in accordance with an embodiment of the disclosure. The host 110 may provide commands and addresses to the memory controller 120 via a command and address bus, and may provide data to or receive data from the memory controller 120 via a data bus. IN response to command and addresses from the host 110, the memory controller 120 may provide commands and addresses to the memory system 130, and may provide data to or receive data from the memory system 130 via a data bus. The host may be a central processing unit, in some examples. In some examples, the memory system 130 may be include a memory package, a memory module (e.g., a dual in-line memory module (DIMM) or a non-volatile DIMM (NVDIMM) that includes a combination of volatile memory devices (e.g., DRAM) and non-volatile memory devices (e.g., flash memory)), one or more memory devices, or any combination thereof. In some examples, the memory controller 120 and the memory system 130 may be configured as a memory system package. In other examples, the memory controller 120 and the memory system 130 may be separate devices. In some examples, the computing system 100 may be configured as a system-on-chip (SoC).

The host 110 may include a traffic prioritization logic circuit 112 and a processor unit(s) 114. The processor unit(s) 114 may execute instructions, which may include storing data at the memory system 130 from time to time during the processing of instructions. To store data, the processor unit(s) 114 may provide access requests to the traffic prioritization logic circuit 112. The traffic prioritization logic circuit 112 may prioritize access requests to be provided to the memory controller 120 based on several criteria, including time of receipt, status of the memory system 130, and other prioritization criteria. The traffic prioritization logic circuit 112 may provide commands and addresses to the memory controller 120 via the command and address bus, and may provide data to or receive data from the memory controller 120 via the data bus.

The memory controller 120 may include a access request processor 122, a queue 124, and a refresh manager circuit 126. The access request processor 122 may process commands and addresses received from the host 110 via the command and address bus to provide pass data between the host 110 and the memory system 130. The access request processor 122 may be configured to place access requests directed to addresses of the memory system 130 that are unavailable in the queue 124. The refresh manager circuit 126 may be configured to manage refresh operations on the memory system 130 by causing issuance of a refresh management (RFM) command to the memory system 130 to periodically refresh individual ones of the banks memory system 130(1)-(n). Refresh management may be intended for data retention (e.g., in the cases of volatile memory), and/or for data integrity to circumvent attacks on the memory system 130, such as row hammer attacks.

The memory system 130 may be divided into sections or banks memory system 130(1)-(n) of memory cell arrays configured to store data. Each of the banks memory system 130(1)-(n) may be independently accessible without affecting operations on other banks memory system 130(1)-(n), but can only generally handle one operation at a time. The banks memory system 130(1)-(n) may include volatile memory cells, and as such, may need to be refreshed periodically for data retention, as well as to prevent attacks, such as row hammer attacks. In some examples, depending on a mode of operation, refresh operations may be managed by the memory controller 120, the memory system 130, or both.

When managed by the memory controller 120, the refresh manager circuit 126 may issue a RFM command and a bank address identifying one of the banks memory system 130(1)-(n) over the command and address bus to the memory system 130. The memory system 130 may decode the RFM command and bank address, and may place the target one of the banks memory system 130(1)-(n) into a refresh state. While in the refresh state, the target bank is unavailable/unable to process other access commands until the refresh operation is complete. Once finished, the memory system 130 may provide an indication that the refresh operation on the target bank is complete, and the target bank is back online (e.g., available) and ready to process access requests. In other examples, the refresh operation is time based, and the memory controller 120 starts sending access commands upon expiration of a timer.

Typically, the memory controller 120 may use the queue 124 to hold access requests from the host 110 that aren't yet available to be performed for one reason or another, including that a bank is unavailable because it is performing a refresh in response to a RFM command from the memory controller 120. However, a bank undergoing a refresh operation may be unavailable for a longer period of time while the refresh operation is being completed, which could result in the queue 124 being filled with access requests directed to the unavailable bank. Once the queue 124 is full, the memory controller 120 may notify the host 110 that it is no longer able to process any new access requests, which may increase tail latency until the queue 124 can be cleared out.

Thus, to mitigate the chances of the queue 124 being filled with access requests to a bank undergoing a refresh operation in response to the RFM command, the refresh manager circuit 126 may send a bank status signal or command indicating that a bank is unavailable, along with the corresponding bank address, to the host 110. In some examples, the bank address sent to the memory system 130 is different than the bank address sent to the host 110. For example, the bank address sent to the host 110 may be a logical bank address and the bank address sent to the memory system 130 may be a physical bank address. The memory controller 120 may include a translation buffer to translate between the two address topologies. The bank status signal may be sent by the refresh manager circuit 126 in response to provision of the RFM command to the memory system 130, in some examples, In other examples, the bank status signal may be sent by the refresh manager circuit 126 in response to an acknowledgment that the refresh operation has started at the target bank of the memory system 130. In response to receipt of the bank status symbol indicating that the bank is unavailable, the traffic prioritization logic circuit 112 of the host 110 may de-prioritize access request to the unavailable bank, and queue them until the bank becomes available again. This may prevent the queue 124 of the memory controller 120 from being filled with access requests to an unavailable bank.

Once the refresh operation is complete, (e.g., either based on expiration of a timer or receipt of a refresh complete signal or command from the memory system 130), the refresh manager circuit 126 may send the bank status signal or command indicating that a bank is available, along with the corresponding bank address, to the host 110. In response, the traffic prioritization logic circuit 112 may re-prioritize sending access requests to the previously-unavailable bank. In some examples, the traffic prioritization logic circuit 112 may place a higher priority on access requests directed to the previously-unavailable bank to clear out a queue of access requests that may have accumulated while the bank was unavailable. Use of the bank status command or signal to stop or pause provision of access requests to a bank that is unavailable due to a refresh management command may reduce tail latency by preventing the queue 124 of the memory controller 120 from filling up with access requests to an unavailable bank.

Figure 2:
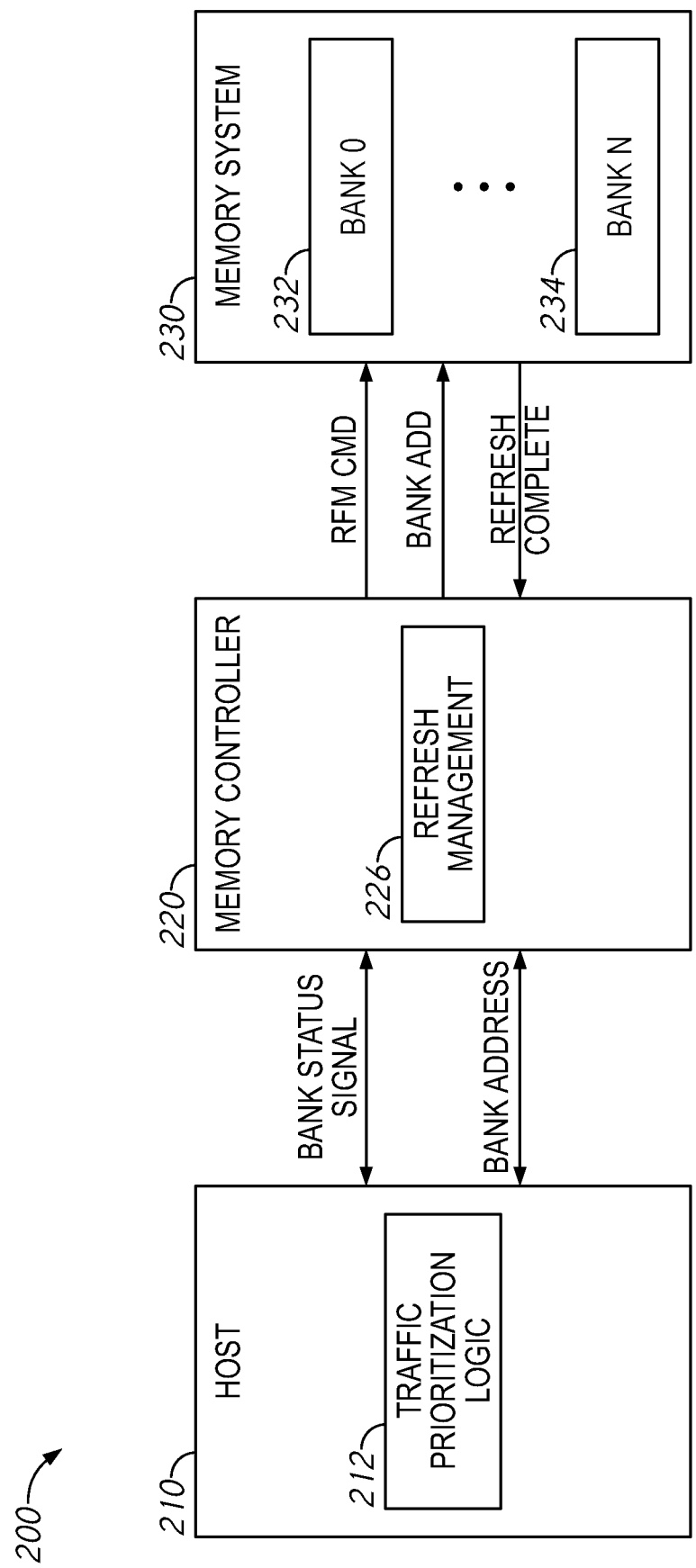
FIG. 2 is a block diagram of a computing system that includes a host, a memory controller, and a memory system, in accordance with an embodiment of the disclosure.

FIG. 2 is a block diagram of a computing system 200 that includes a host 210, a memory controller 220, and a memory system 230, in accordance with an embodiment of the disclosure. The host 210 may provide commands and addresses to the memory controller 220 via a command and address bus, and may provide data to or receive data from the memory controller 220 via a data bus. IN response to command and addresses from the host 210, the memory controller 220 may provide commands and addresses to the memory system 230, and may provide data to or receive data from the memory system 230 via a data bus. The host may be a central processing unit, in some examples. In some examples, the memory system 230 may be include a memory package, a memory module (e.g., a dual in-line memory module (DIMM) or a non-volatile DIMM (NVDIMM) that includes a combination of volatile memory devices (e.g., DRAM) and non-volatile memory devices (e.g., flash memory)), one or more memory devices, or any combination thereof. In some examples, the memory controller 220 and the memory system 230 may be configured as a memory system package. In other examples, the memory controller 220 and the memory system 230 may be separate devices. In some examples, the computing system 200 may be configured as a system-on-chip (SoC). In some examples, the computing system 100 of FIG. 1 may implement the computing system 200.

The host 210 may include a traffic prioritization logic circuit 212. The host 210 may execute instructions, which may include storing data at the memory system 230 from time to time during the processing of instructions. To store data, the traffic prioritization logic circuit 212 may provide access requests to the memory controller 220. The traffic prioritization logic circuit 212 may prioritize access requests to be provided to the memory controller 220 based on several criteria, including time of receipt, status of the memory system 230, and other prioritization criteria. The traffic prioritization logic circuit 212 may provide commands and addresses to the memory controller 220 via the command and address bus, and may provide data to or receive data from the memory controller 220 via the data bus.

The memory controller 220 may include a refresh manager circuit 226. The refresh manager circuit 226 may be configured to manage refresh operations on the memory system 230 by causing issuance of a refresh management (RFM) command to the memory system 230 to periodically refresh individual ones of the banks memory system 230 (1)-(*n*). Refresh management may be intended for data retention (e.g., in the cases of volatile memory), and/or for data integrity to circumvent attacks on the memory system 230, such as row hammer attacks.

The memory system 230 may be divided into sections or banks memory system 230(1)-(*n*) of memory cell arrays configured to store data. Each of the banks memory system 230(1)-(*n*) may be independently accessible without affecting operations on other banks memory system 230(1)-(*n*), but can only generally handle one operation at a time. The banks memory system 230(1)-(*n*) may include volatile memory cells, and as such, may need to be refreshed periodically for data retention, as well as to prevent attacks, such as row hammer attacks. In some examples, depending on a mode of operation, refresh operations may be managed by the memory controller 220, the memory system 230, or both.

When managed by the memory controller 220, the refresh manager circuit 226 may issue a RFM command and a bank address identifying one of the banks memory system 230 (1)-(*n*) over the command and address bus to the memory system 230. The memory system 230 may decode the RFM command and bank address, and may place the target one of the banks memory system 230(1)-(*n*) into a refresh state. While in the refresh state, the target bank is unavailable/unable to process other access commands until the refresh operation is complete. Once finished, the memory system 230 may provide an indication that the refresh operation on the target bank if complete, and the target bank is back online and ready to process access requests. In other examples, the refresh operation is time based, and the refresh manager circuit 226 starts sending access commands upon expiration of a timer.

A bank undergoing a refresh operation may be unavailable for a period of time while the refresh operation is being completed, which could result in filling a queue of the memory controller 220 with access requests directed to the unavailable bank. Once the queue is full, the memory controller 220 may notify the host 210 that it is no longer able to process any new access requests, which may increase tail latency until the queue can be cleared out.

Thus, to mitigate the chance of the queue being filled with access requests to a bank undergoing a refresh operation in response to the RFM command, the refresh manager circuit 226 may send a bank status signal or command indicating that a bank is unavailable, along with the corresponding bank address, to the host 210. In some examples, the bank address sent to the memory system 130 is different than the bank address sent to the host 110. For example, the bank address sent to the host 110 may be a logical bank address and the bank address sent to the memory system 130 may be a physical bank address. The memory controller 120 may include a translation buffer to translate between the two address topologies. The bank status signal may be sent in response to provision of the RFM command to the memory system 230, in some examples, In other examples, the bank status signal may be sent in response to an acknowledgment that the refresh operation has started at the target bank of the memory system 230. In response to receipt of the bank status symbol indicating that the bank is unavailable, the traffic prioritization logic circuit 212 of the host 210 may de-prioritize access request to the unavailable bank, and queue them until the bank becomes available again. This may prevent the queue of the memory controller 220 from being filled with access requests to an unavailable bank.

Once the refresh operation is complete, (e.g., either based on expiration of a timer or receipt of a refresh complete signal or command from the memory system 230), the refresh manager circuit 226 may send the bank status signal or command indicating that a bank is available, along with the corresponding bank address, to the host 210. In response, the traffic prioritization logic circuit 212 may re-prioritize sending access request to the previously-unavailable bank. In some examples, the traffic prioritization logic circuit 212 may place a higher priority on access requests directed to the previously-unavailable bank to clear out a queue of access requests that may have accumulated while the bank was unavailable. Use of the bank status command or signal to stop or pause provision of access requests to a bank that is unavailable due to a refresh management command may reduce tail latency by preventing the queue of the memory controller 220 from filling up with access requests to an unavailable bank.

Figure 3:
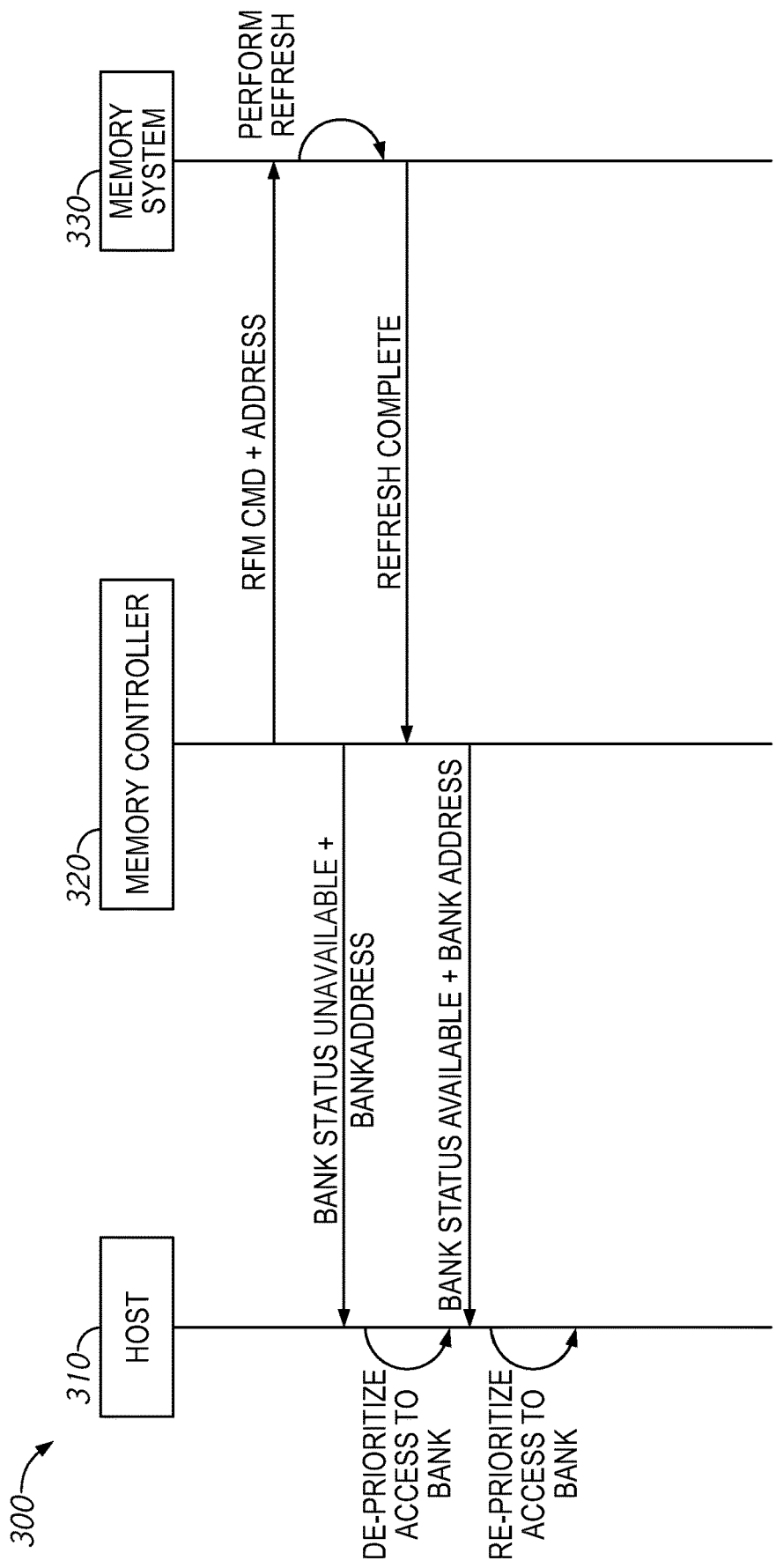
FIG. 3 is a sequence diagram of refresh command communication between a host, a memory controller, and a memory system, in accordance with an embodiment of the disclosure.

FIG. 3 is a sequence diagram 300 of refresh command communication between a host 310, a memory controller 320, and a memory system 330, in accordance with an embodiment of the disclosure. The host 110 of FIG. 1 and/or the host 210 of FIG. 2 may implement the host 310, memory controller 120 of FIG. 1 and/or the host 210 of FIG. 2 may implement the memory controller 320, and the memory system 130 of FIG. 1 and/or the memory system 230 of FIG. 2 may implement the memory system 330, in some examples.

The banks of the memory system 330 may include volatile memory cells, and as such, may need to be refreshed periodically for data retention, as well as to prevent attacks, such as row hammer attacks. In some examples, depending on a mode of operation, refresh operations may be managed by the memory controller 320, the memory system 330, or both.

When managed by the memory controller 320, the memory controller 320 may issue a RFM command and a bank address identifying a target one of the banks of the memory system 330 to the memory system 330. The memory system 330 may decode the RFM command and bank address, and may place the target one of the banks into a refresh state to begin the refresh operation. While in the refresh state, the target bank is unavailable process other access commands until the refresh operation is complete.

In response to provision of the RFM command, the memory controller 320 may issue a bank status signal and bank address to the host 310 indicating that a target one of the banks of the memory system 330 is unavailable. In response to the bank status signal indicating the bank is unavailable, the host 310 may de-prioritize access requests to the target bank.

Once finished, the memory system 330 may provide an indication that the refresh operation on the target bank if complete, and the target bank is back online and ready to process access requests. In other examples, the refresh operation is time based, and the memory controller 320 starts sending access commands upon expiration of a timer.

In response to receipt of the refresh complete signal from the memory system 330, the memory controller 320 may issue the bank status signal and bank address to the host 310 indicating that the target one of the banks of the memory system 330 is available. In response to the bank status signal indicating the bank is available, the host 310 may re-prioritize access requests to the target bank. In some examples, the host 310 may place a higher priority on access requests directed to the previously-unavailable bank to clear out a queue of access requests that may have accumulated while the bank was unavailable. Use of the bank status command or signal to stop or pause provision of access requests to a bank that is unavailable due to a refresh management command may reduce tail latency by preventing the queue of the memory controller 320 from filling up with access requests to an unavailable bank.

Figure 4:
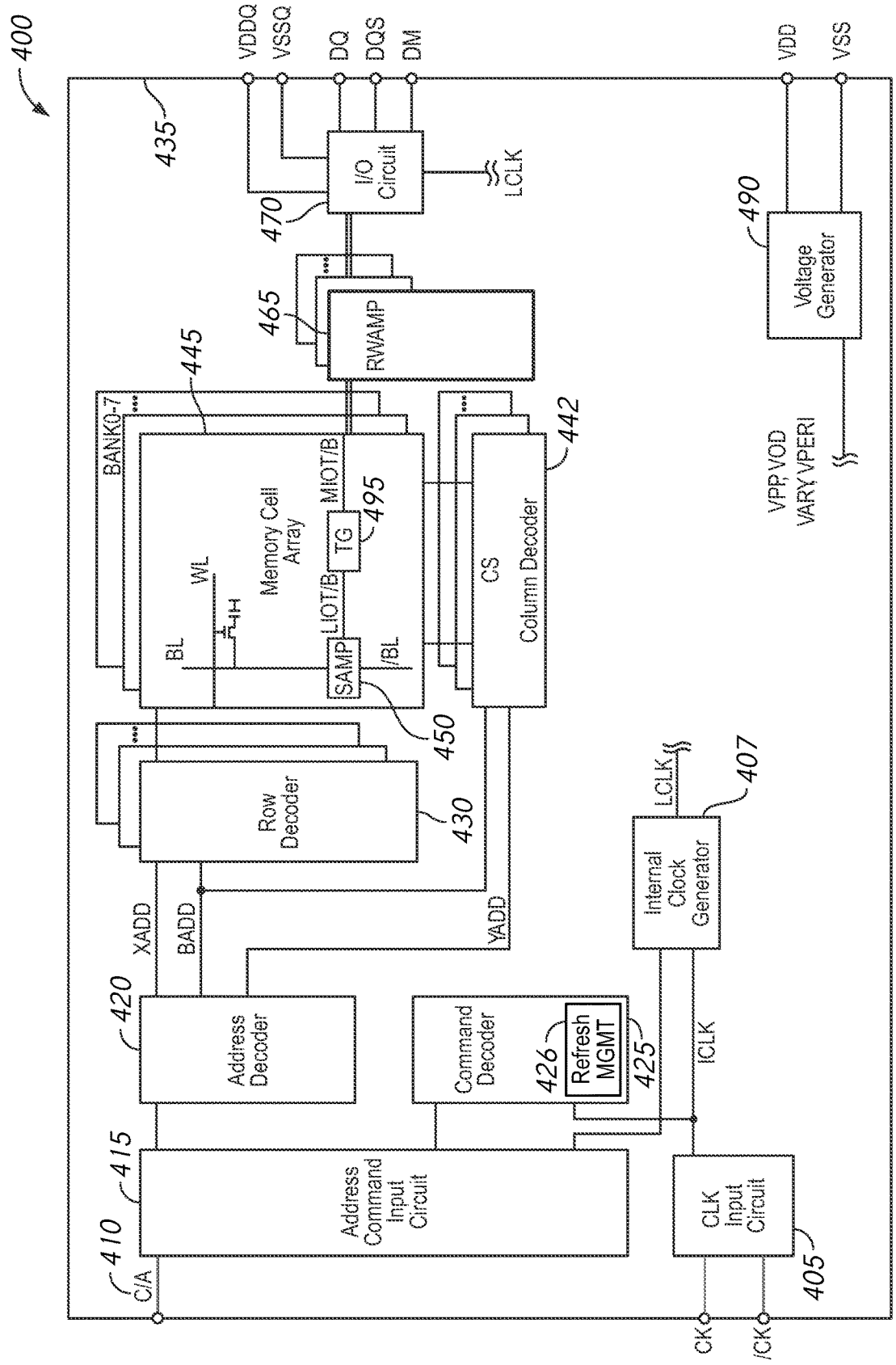
FIG. 4 is a schematic block diagram of a semiconductor device 400, in accordance with an embodiment of the present disclosure.

FIG. 4 is a schematic block diagram of a semiconductor device 400, in accordance with an embodiment of the present disclosure. For example, the semiconductor device semiconductor device 400 may include a chip 435. The chip 435 may include a clock input circuit 405, an internal clock generator 407, an address command input circuit 415, an address decoder 420, a command decoder 425, a plurality of row decoders 430, a memory cell array 445 including sense amplifiers 450 and transfer gates 495, a plurality of column decoders 440, a plurality of read/write amplifiers 465, an input/output (I/O) circuit 470, and a voltage generator 490. The semiconductor device semiconductor device 400 may include a plurality of external terminals including address and command terminals coupled to command/address bus 410, clock terminals CK and /CK, data terminals DQ, DQS, and DM, and power supply terminals VDD, VSS, VDDQ, and VSSQ. The chip 435 may be mounted on a substrate, for example, a memory module substrate, a mother board or the like. In some examples, the semiconductor device semiconductor device 400 may in implemented in the memory system 130 of FIG. 1, the memory system 230 of FIG. 2, and/or the memory system 330 of FIG. 3.

The memory cell array 445 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. The selection of the word line WL for each bank is performed by a corresponding row decoder 430 and the selection of the bit line BL is performed by a corresponding column decoder 440. The plurality of sense amplifiers 450 are located for their corresponding bit lines BL and coupled to at least one respective local I/O line further coupled to a respective one of at least two main I/O line pairs, via transfer gates TG 495, which function as switches.

The address/command input circuit 415 may receive an address signal and a bank address signal from outside at the command/address terminals via the command/address bus 410 and transmit the address signal and the bank address signal to the address decoder 420. The address decoder 420 may decode the address signal received from the address/command input circuit 415 and provide a row address signal XADD to the row decoder 430, and a column address signal YADD to the column decoder 440. The address decoder 420 may also receive the bank address signal and provide the bank address signal BADD to the row decoder 430 and the column decoder 440.

The address/command input circuit 415 may receive a command signal from outside, such as, for example, a memory controller 405 at the command/address terminals via the command/address bus 410 and provide the command signal to the command decoder 425. The command decoder 425 may decode the command signal and provide generate various internal command signals. For example, the internal command signals may include a row command signal to select a word line, a column command signal, such as a read command or a write command, to select a bit line. In some examples, the command decoder 425 may include a refresh management logic 426 configured to manage refresh operations in response to a refresh management (RFM) command and a corresponding bank address BADD. In response to receipt of the RFM command and the bank address BADD, the refresh management logic 426 may cause the refresh operation to commence on the BANK0-7 corresponding to the bank address. In some examples, the refresh management logic 426 may also send a signal indicating the refresh has started, such as updating a status signal. When the refresh is complete, the refresh management logic 426 may send a refresh complete signal to indicate that the BANK0-7 associated with the bank address is available to perform other access operations.

When a read command is issued and a row address and a column address are timely supplied with the read command, read data is read from a memory cell in the memory cell array 445 designated by the row address and the column address. The read/write amplifiers 465 may receive the read data DQ and provide the read data DQ to the IO circuit 470. The IO circuit 470 may provide the read data DQ to outside via the data terminals DQ, together with a data strobe signal at DQS and/or a data mask signal at DM. Similarly, when the write command is issued and a row address and a column address are timely supplied with the write command, and then the input/output circuit 470 may receive write data at the data terminals DQ, together with a data strobe signal at DQS and/or a data mask signal at DM and provide the write data via the read/write amplifiers 465 to the memory cell array 445. Thus, the write data may be written in the memory cell designated by the row address and the column address.

Turning to the explanation of the external terminals included in the semiconductor device semiconductor device 400, the clock terminals CK and /CK may receive an external clock signal and a complementary external clock signal, respectively. The external clock signals (including complementary external clock signal) may be supplied to a clock input circuit 405. The clock input circuit 405 may receive the external clock signals and generate an internal clock signal ICLK. The clock input circuit 405 may provide the internal clock signal ICLK to an internal clock generator 407. The internal clock generator 407 may generate a phase controlled internal clock signal LCLK based on the received internal clock signal ICLK and a clock enable signal CKE from the address/command input circuit 415. Although not limited thereto, a DLL circuit may be used as the internal clock generator 407. The internal clock generator 407 may provide the phase controlled internal clock signal LCLK to the IO circuit 470 and a timing generator 409. The IO circuit 470 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 490. The voltage generator circuit 490 may generate various internal voltages, VPP, VOD, VARY, VPERI, and the like based on the power supply voltages VDD and VSS. The internal voltage VPP is mainly used in the row decoder 430, the internal voltages VOD and VARY are mainly used in the sense amplifiers 450 included in the memory cell array 445, and the internal voltage VPERI is used in many other circuit blocks. The power supply terminals may also receive power supply voltages VDDQ and VSSQ. The IO circuit 470 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 470.

Figure 5:
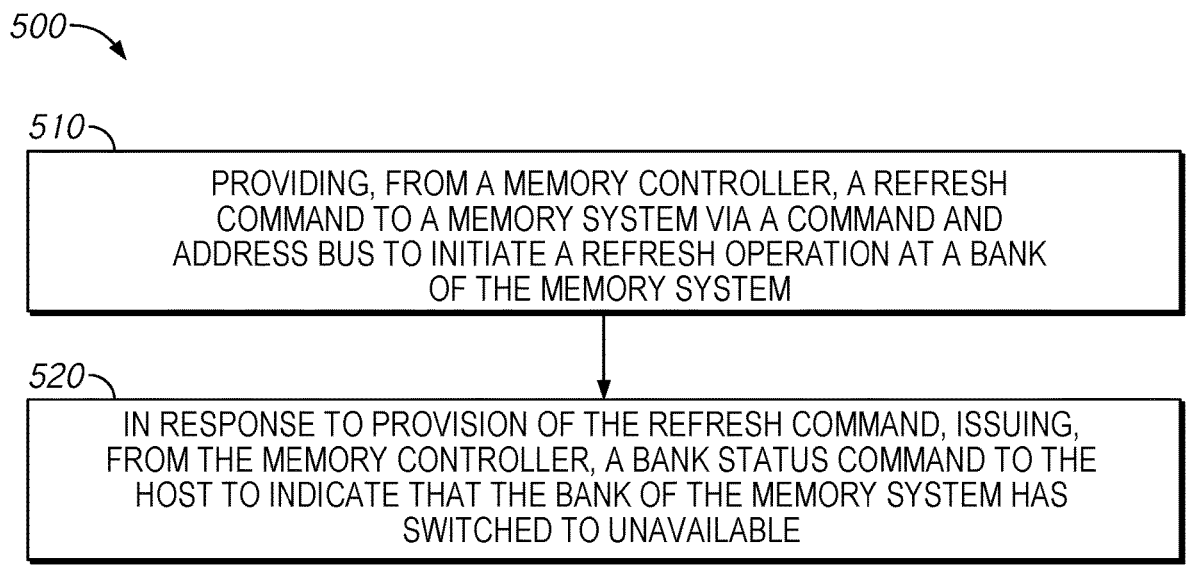
FIG. 5 is a flowchart of a method to pause access requests from a host to a memory controller during a refresh operation, in accordance with an embodiment of the disclosure.

FIG. 5 is a flowchart of a method 500 to pause access requests from a host to a memory controller during a refresh operation, in accordance with an embodiment of the disclosure. The method 500 may be implemented by any of the memory controller 120 of FIG. 1, the memory controller 220 of FIG. 2, and/or the memory controller 320 of FIG. 3.

The method 500 may include providing, from a memory controller, a refresh command to a memory system via a command and address bus to initiate a refresh operation at a bank of the memory system, at 510.

The method 500 may further include, in response to provision of the refresh command, issuing, from the memory controller, a bank status command to the host to indicate that the bank of the memory system has switched to unavailable, at 520. In some examples, the method 500 may further include issuing a bank address corresponding to the bank of the memory system performing the refresh operation via the command and address bus.

In some examples, the method 500 may further include, in response to receipt of a refresh complete signal from the memory system, issuing the bank status command to the host to indicate that the bank of the memory system has switched to available. In some examples, the method 500 may further include receiving the refresh complete signal from the memory system. In other examples, the method 500 may further include, in response to a lapse of a predetermined time period for the refresh operation, issuing the bank status command to the host to indicate that the bank of the memory system has switched to available.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
a memory controller comprising a refresh manager circuit configured to provide a refresh command received from a host to a memory system via a command and address bus to initiate a refresh operation at a bank of the memory system, wherein, in response to provision of the refresh command, the refresh manager circuit is further configured to issue a bank status command and a logical bank address of the bank to the host to indicate that the bank of the memory system has switched to unavailable, wherein, in response to a lapse of a predetermined time period for the refresh operation, the refresh manager circuit is further configured to issue the bank status command to the host to indicate that the bank of the memory system has switched to available.

2. The apparatus of claim 1, wherein the refresh manager circuit is further configured to issue a bank address corresponding to the bank of the memory system performing the refresh operation via the command and address bus.

3. The apparatus of claim 1, wherein, in response to receipt of a refresh complete signal from the memory system, the refresh manager circuit is further configured to issue the bank status command to the host to indicate that the bank of the memory system has switched to available.

4. The apparatus of claim 3, wherein the refresh manager circuit is configured to receive the refresh complete signal from the memory system.

5. The apparatus of claim 1, further comprising the memory system.

6. The apparatus of claim 5, wherein the memory system comprises a system on a chip.

7. The apparatus of claim 5, wherein the memory system comprises a memory module.

8. An apparatus comprising:
a memory controller comprising:
a refresh manager circuit configured to provide a refresh command received from a host to a memory system via a command and address bus to initiate a refresh operation at a bank of the memory system, wherein, in response to provision of the refresh command, the refresh manager circuit is further configured to issue a bank status command and a logical bank address of the bank to the host to indicate that the bank of the memory system has switched to unavailable; and
a queue configured to store memory access requests received from the host for execution at the memory system, wherein, while the memory system is performing the refresh operation at the bank of the memory system, the queue is configured to store received access requests directed to the bank of the memory system.

9. A host comprising:
a processor unit configured to initiate access commands to a memory controller;
a traffic prioritization logic circuit configured to:
de-prioritize access commands to a bank address associated with a memory system in response to receipt of a bank status command from the memory controller indicating the bank address has switched to being unavailable;
queue the de-prioritized access commands until the bank address becomes available; and
prioritize the access commands to the bank address over access commands to other bank addresses in response to receipt of the bank status command from the memory controller indicating the bank address has switched to being available.

10. The host of claim 9, wherein the traffic prioritization logic circuit is configured to receive the bank address with the bank status command from the memory controller.

11. The host of claim 10, wherein the traffic prioritization logic circuit is further configured to re-prioritize the access commands to the bank address in the queue in response to receipt of the bank status command from the memory controller indicating the bank address has switched to being available.

12. The host of claim 9, wherein the traffic prioritization logic circuit configured to de-prioritize access commands to a bank address associated with a memory system includes pausing all access requests to the bank address.

13. The host of claim 9, wherein the traffic prioritization logic circuit is configured to receive the bank status command from the memory controller indicating the bank address has switched to being available due to a refresh management command issued from the memory controller to the memory system.

14. A method comprising:
receiving, by a memory controller, a refresh command from a host;
providing, from the memory controller, the refresh command to a memory system via a command and address bus to initiate a refresh operation at a bank of the memory system;
in response to provision of the refresh command, issuing, from the memory controller, a bank status command and a logical bank address of the bank to the host to indicate that the bank of the memory system has switched to unavailable; and
in response to a lapse of a predetermined time period for the refresh operation, issuing the bank status command to the host to indicate that the bank of the memory system has switched to available.

15. The method of claim 14, further comprising issuing a bank address corresponding to the bank of the memory system performing the refresh operation via the command and address bus.

16. The method of claim 14, further comprising, in response to receipt of a refresh complete signal from the memory system, issuing the bank status command to the host to indicate that the bank of the memory system has switched to available.

17. The method of claim 16, further comprising receiving the refresh complete signal from the memory system.

* * * * *